US009061902B2

(12) United States Patent
Cui et al.

(10) Patent No.: US 9,061,902 B2
(45) Date of Patent: Jun. 23, 2015

(54) CRYSTALLINE-AMORPHOUS NANOWIRES FOR BATTERY ELECTRODES (75) Inventors: Li-Feng Cui, Palo Alto, CA (US); Candace K. Chan, San Antonio, TX (US); Riccardo Ruffo, Bresso (IT); Hailin Peng, Beijing (CN); Yi Cui, Sunnyvale, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 309 days.

(21) Appl. No.: 12/642,057

(22) Filed: Dec. 18, 2009

(65) Prior Publication Data

US 2011/0151290 A1 Jun. 23, 2011

(51) Int. Cl.
*H01M 10/44* (2006.01)
*H01M 4/04* (2006.01)
*H01M 4/02* (2006.01)
*B82Y 30/00* (2011.01)
*H01M 4/38* (2006.01)
*C08J 5/04* (2006.01)
*C08J 5/06* (2006.01)
*H01L 29/41* (2006.01)
*B82Y 10/00* (2011.01)
*H01M 4/134* (2010.01)
*H01M 4/1395* (2010.01)
*H01M 10/0525* (2010.01)

(52) U.S. Cl.
CPC .............. *B82Y 30/00* (2013.01); *Y02E 60/50* (2013.01); *H01M 4/386* (2013.01); *C08J 5/047* (2013.01); *C08J 5/06* (2013.01); *H01L 29/413* (2013.01); *B82Y 10/00* (2013.01); *H01M 4/134* (2013.01); *H01M 4/1395* (2013.01); *H01M 10/0525* (2013.01); *H01M 10/44* (2013.01); *Y02T 10/7011* (2013.01); *Y02E 60/122* (2013.01)

(58) Field of Classification Search
CPC ..... Y02E 60/50; Y02E 60/122; H01M 4/386; H01M 10/0525; C08J 5/06; C08J 5/047; H01L 29/413
USPC ............ 429/209, 400, 408; 428/375; 977/762
See application file for complete search history.

(56) References Cited

U.S. PATENT DOCUMENTS

| 4,436,796 | A | 3/1984 | Huggins et al. |
| 5,457,343 | A | 10/1995 | Ajayan et al. |
| 5,837,081 | A | 11/1998 | Ting et al. |
| 5,997,832 | A | 12/1999 | Lieber et al. |
| 6,334,939 | B1 | 1/2002 | Zhou et al. |
| 6,423,453 | B1 | 7/2002 | Noda |
| 6,514,395 | B2 | 2/2003 | Zhou et al. |
| 6,988,304 | B2 | 1/2006 | Moseley et al. |
| 7,057,288 | B2 * | 6/2006 | Yuasa ............................ 257/759 |
| 7,189,476 | B1 | 3/2007 | Macklin et al. |
| 7,402,829 | B2 | 7/2008 | Green |
| 7,408,829 | B2 | 8/2008 | Kuang et al. |
| 7,683,359 | B2 | 3/2010 | Green |
| 7,816,031 | B2 | 10/2010 | Cui et al. |
| 2003/0068448 | A1 * | 4/2003 | Cheng et al. .................. 427/569 |
| 2003/0089899 | A1 | 5/2003 | Lieber et al. |
| 2003/0165740 | A1 | 9/2003 | Edwards et al. |
| 2005/0279274 | A1 | 12/2005 | Niu et al. |
| 2006/0035149 | A1 | 2/2006 | Nanba et al. |
| 2006/0097691 | A1 | 5/2006 | Green |
| 2006/0182966 | A1 * | 8/2006 | Lee et al. ....................... 428/375 |
| 2006/0216603 | A1 | 9/2006 | Choi |
| 2007/0059600 | A1 | 3/2007 | Kim et al. |
| 2008/0008844 | A1 | 1/2008 | Bettge et al. |
| 2008/0044732 | A1 | 2/2008 | Salot et al. |
| 2008/0145761 | A1 | 6/2008 | Petrat et al. |
| 2008/0261116 | A1 | 10/2008 | Burton |
| 2008/0280169 | A1 | 11/2008 | Niu et al. |
| 2009/0068553 | A1 | 3/2009 | Firsich |

FOREIGN PATENT DOCUMENTS

| WO | WO 2005/076389 | 8/2005 |
| WO | WO 2007/083152 | 7/2007 |
| WO | WO 2007/083155 | 7/2007 |
| WO | WO 2008/139157 | 11/2008 |
| WO | WO 2009/010757 | 1/2009 |
| WO | WO 2009/010758 | 1/2009 |
| WO | WO 2009/010759 | 1/2009 |

OTHER PUBLICATIONS

Chan et al., "High-performance lithium battery anodes using silicon nanowires", nature nanotechnology, vol. 3, Jan. 2008, pp. 31-35.*
Yu et al., "Silicon Nanowires: Preparation, Device Fabrication, and Transport Properties", J. Phys. Chem. B 2000, 104, 11864-11870.*
Cui et al.,"Diameter-controlled synthesis of single-crystal silicon nanowires", Appl. Appl. Phys. Lett. 78, 2214 (2001).*
Sharma et al., "Raman analysis of oxide cladded Silicon core nanowires grown with solid silicon feed stock", Nano-Electronics Centre, Advanced Technology Institute, University of Surrey, Guildford, UK GU2 7XH, 2011.*
Armstrong et al. "TiO$_2$(B) Nanowires as an Improved Anode Material for Lithium-Ion Batteries Containing LiFePO$_4$ or LiNi$_{0.5}$Mn$_{1.5}$O$_4$ Cathodes and a Polymer Electrolyte." Adv. Mater. 18, 2597-2600 (2006).
Boukamp et al. "All-solid lithium electrodes with mixed-conductor matrix." J. Electrochem. Soc. 128, 725-729 (1981).
Chan et al. "High-performance lithium battery anodes using silicon nanowires." Nature Nanotechnology 3, 31-35 (Jan. 2008).
Dick et al. "A new understanding of Au-assisted growth of III-V semiconductor nanowires." Adv. Funct. Mater. 15, 1603-1610 (2005).

(Continued)

Primary Examiner — Ladan Mohaddes
(74) Attorney, Agent, or Firm — Crawford Maunu PLLC (57) ABSTRACT Electrodes, batteries, methods for use and manufacturing are implemented to provide ion-based electrical power sources and related devices. Consistent with one such method, a battery electrode is produced having nanowires of a first material. The electrode is produced using a single growth condition to promote growth of crystalline nanowires on a conductive substrate and of the first material, and promote, by maintaining the growth condition, growth of an amorphous portion that surrounds the crystalline nanowires.

17 Claims, 9 Drawing Sheets

(56) References Cited

OTHER PUBLICATIONS

Givargizov. "Fundamental Aspects of VLS Growth." Journal of Crystal Growth 31, 20-30 (1975).
Goldstein et al. "Melting in Semiconductor Nanocrystals." Science 256, 1425-1427 (Jun. 1992).
Graetz et al. "Highly-Reversible Lithium Storage in Nanostructured Silicon." Electro. and Solid-State Letters 6(2), A194-A197 (2003).
Hannon et al. "The influence of the surface migration of gold on the growth of silicon nanowires." Nature 440, 69-71 (2006).
Hatchard et al. "In Situ XRD and Electrochemical Study of the Reaction of Lithium with Amorphous Silicon." Journal of the Electro. Chem. Society 151, A838-A842 (2004).
Huang et al. "Catalytic Growth of Zinc Oxide Nanowires by Vapor Transport." Adv. Mater. 13(2), 113-116 (2001).
Levitt. *Whisker Technology*. Wiley Interscience, 1970.
Li et al. "A High Capacity Nano-Si Composite Anode Material for Lithium Rechargeable Batteries." *Electrochemical and Solid-State Letters*, 2 (11) 547-549 (1999).
Li et al. "Rate Capabilities of Nanostructured $LiMn_2O_4$ Electrodes in Aqueous Electrolyte." J. Electrochem. Soc. 147, 2044-2049 (2000).
Li et al. "An In Situ X-Ray Diffraction Study of the Reaction of Li with Crystalline Si." Journal of the Electro. Chem. Society 154, A156-A161 (2007).
Nam et al. "Virus-Enabled Synthesis and Assembly of Nanowires for Lithium Ion Battery Electrodes." Science 312, 88-888 (May 2006).
Nazri et al. *Lithium Batteries: Science and Technology*. Springer, 708 pgs. (2004). Overview only, 1 page.
Netz et al. "The formation and properties of amorphous silicon as negative electrode reactant in lithium systems." Power Sources 119-121, 95-100 (2003).
Obrovac et al. "Reversible Cycling of Crystalline Silicon Powder." Journal of the Electro. Chem. Society 154, A103-A108 (2007).
Pan et al. "Nanobelts of Semiconducting Oxides." Science 291, 1947-1949 (Mar. 2001).
Poizot et al. "Nano-sized transition-metal oxides as negative-electrode materials for lithium-ion batteries." Nature 407, 496-499 (Sep. 2000).
Shaju et al. "Mesoporous and nanowire $Co_3O_4$ as negative electrodes for rechargeable lithium batteries." Phys. Chemistry Chem. Physics 9, 1837-1842 (2007).
Sharma et al. "Thermodynamic Properties of the Lithium-Silicon System." Journal of the Electrochemical Society 123, 1763-1768 (Dec. 1976).
Shodai et al. "Study of $Li_{3-x}M_xN$(M: Co, Ni or Cu) system for use as anode material in lithium rechargeable cells." Solid State Ionics 86-88(2), 785-789 (Jul. 1996).
Uehara et al. "Thick vacuum deposited silicon films suitable for the anode of Li-ion battery." Journal of Power Sources 146, 441-444 (2005).
Westwater et al. "Growth of silicon nanowires via gold/silane vapor-liquid-solid reaction." Journal Va. Sci. Technology B 15(3). 554-557 (May/Jun. 1997).
Yang et al. "Small-Particle Size Multiphase Li-Alloy Anodes for Lithium-Ion-Batteries." Solid State Ionics 90, 281-287 (1996).
Yazawa et al. "Effect of one monolayer of surface gold atoms on the epitaxial growth of InAs nanowhiskers." Appl. Phys. Lett. 61(17), 2051-2053 (Oct. 1992).
Sharma et al. "Diameter control of Ti-catalyzed silicon nanowires." Journal of Crystal Growth 267 (2004), pp. 613-618.
Sharma et al. "Structural characteristics and connection mechanism of gold-catalyzed bridging silicon nanowires." Journal of Crystal Growth 280 (2005), pp. 562-568.

Chan, C.K., et al., "High Capacity Li Ion Battery Anodes Using Ge Nanowires," Nano Letters, vol. 8, No. 1, pp. 307-309 (2008).
Che, G., et al., "Carbon nanotubule membranes for electrochemical energy storage and production," Nature 393, pp. 346-349 (1998).
Park, M.-S. et al., "Preparation and electrochemical properties of $SnO_2$ nanowires for application in lithium-ion batteries," Angew. Chem. Int. Edn 46, pp. 750-753 (2007).
Huggins, R. A. & Nix, W. D., "Decrepitation model for capacity loss during cycling of alloys in rechargeable electrochemical systems," Ionics 6, pp. 57-63 (2000).
Lee, Y. M., et al., "SEI layer formation on amorphous Si thin electrode during precvcling," J.Electrochem. Soc. 154, pp. A515-A519 (2007).
Green, M., et al., "Structured silicon anodes for lithium battery applications," Electrochem. Solid-State Lett. 6, pp. A75-A79 (2003).
Ryu, J. H., et al., "Failure modes of silicon powder negative electrode in lithium secondary batteries," Electrochem. Solid-State Lett. 7, pp. A306-A309 (2004).
Kasavajjula, et al., "Nano- and bulk-silicon-based insertion anodes for lithium-ion secondary cells," J. Power Sources 163, pp. 1003-1039 (2007).
Gao, et al., "Alloy formation in nanostructured silicon," Adv. Mater. 13, pp. 816-819 (2001).
Wang, Y., et al., "Epitaxial growth of silicon nanowires using an aluminum catalyst," Nature Nanotech. 1, pp. 186-189 (2006).
Wu, Y. et al., "Controlled growth and structures of molecular-scale silicon nanowires," Nano Lett. 4, pp. 433-436 (2004).
Zhou, "Controlled Li Doping of Si Nanowires," Applied Physics Letters, vol. 75, No. 16 (Oct. 18, 1999).
Ying et al. "Characterization of $SnO_2$ nanowires as anode materials for Li-ion batteries." Applied Physics Letters 87(11), 2005 (Abstract only).
Robert F. Service, "Weight Loss for Batteries" ScienceNOW Daily News, Aug. 14, 2009.
M. Wang et al., "Electrochemical Intercalation of Lithium into Carbon Nanoparticles" Russian Journal of Electrochemistry, 2006, vol. 42 No. 8. pp. 901-903.
Zhang et al., "Electrochemical performance of lithium ion battery, nano-silicon-based, disordered carbon composite anodes with different microstructures", Science Direct, Journal of Power Sources, Jul. 31, 2003.
Dahn et al., "Energy and Capacity Projections for Practical Dual-Graphite Cells", Journal of the Electrochemical Society, 147 (3) 899-901 (2000).
Xue et al., "An Epoxy-Silane Approach to Prepare Anode Materials for Rechargeable Lithium Ion Batteries", Department of Physics, Simon Fraser University, Burnaby, British Columbia V5A 1S6, Canada, J. Electrochem. Soc., vol. 142, No. 9, Sep. 1995.
Buiel et al., "Li-insertion in hard carbon anode materials for Li-ion batteries", Deaprtment of Physics, Callhousie University, Halifax, Nova Scotia, Canada, B3H 3J5, Electrochemicia Acta 45 (1999) 121-130.
Wang et al., "New Additives to Improve the First-Cycle Charge-Discharge Performance of a Graphite Anode for Lithium-Ion Cells", Journal of the Elctrochemical Society, 152 (10) A 1996-A2001 (2005).
Cao et al., "Surface-Modified Graphite as an Improved Intercalating Anode for Lithium-Ion Batteries", Electrochemical and Solid-State Letters, 6 (2) A30-A33 (2003).
Mueller-Neuhaus et al., Understanding Irreversible Capacity in $LiNi1-\gamma Fey O2$ Cathode Materials, Journal of the Electrochemical Society, 147 (10) 3598-3605 (2000).
Hasegawa, Takahiro et al., "Preparation of carbon gel microspheres containing silicon powder for lithium ion battery anodes," Carbon, vol. 42, Issues 12-13, 2004, pp. 2573-2579.

\* cited by examiner

Voltage profiles

CRYSTALLINE-AMORPHOUS NANOWIRES FOR BATTERY ELECTRODES

FEDERALLY-SPONSORED RESEARCH AND DEVELOPMENT

This invention was made with Government support under contract N00014-08-1-0713 awarded by the Office of Naval Research. The U.S. Government has certain rights in this invention.

FIELD OF THE INVENTION

The present invention relates generally to ion battery arrangements and methods, and more particularly to crystalline-amorphous nanowires useful for electrode arrangements and approaches involving the assembly or manufacture of nanowires for such arrangements.

BACKGROUND

The demand for batteries with high energy capacity, low weight and long lifetime has become increasingly important in a variety of fields and industries, including those relating to portable electronic devices, electric vehicles, and implantable medical devices. For example, the energy capacity, weight and cycle life characteristics are often useful for improving the functionality of a particular device in which the batteries are used. In portable electronic devices and implantable medical devices, these and other related aspects are useful to allow for increases in power (e.g., from additional processing power) and/or reduction in the size of the devices. In electric vehicles, these aspects are often limiting factors in the speed, power and operational range of the electric vehicles.

Various commercial embodiments of batteries function as an electrochemical cell that stores and converts chemical energy from chemical oxidation and reduction reactions into a useable electrical form. The chemical reactions occur in the materials composing the two electrodes of the battery, such as reduction occurring in the cathode and oxidation occurring in the anode. These reactions are due in part to a difference in electrochemical potential between the materials comprising the anode and cathode. In many ion-based batteries, the two materials function as electrodes and are separated by an ionic conductor, such as an electrolyte, that is otherwise electrically insulating. Each electrode material is electrically connected to an electronically conducting, preferably metallic, material sometimes called the current collector. The current collectors can then be connected to one another using an external circuit that allows for electron transfer therebetween. To equalize the potential difference, the anode releases ions (e.g., by oxidizing to form the ions) when electrons are allowed to flow through the external circuit. The flow of electrons is balanced by the flow of ions through the electrolyte. The ions then react with the chemically reactive material of the cathode. The number of ions that a material can accept is known as the specific capacity of that material. Battery electrode materials are often defined in terms of the energy capacity per weight, for example in mAh/g. Much research has been devoted to creating and developing higher energy density electrode materials for higher capacity batteries.

A specific type of battery is a Lithium-ion battery, or Li-ion battery. Li-ion batteries transport Li ions between electrodes to effect charge and discharge states in the battery. One type of electrode uses graphite as the anode. Graphite anodes have reversible (rechargeable) capacities that are on the order of 372 mAh/g. Graphite anodes function by intercalation of Li ions between the layered-structure. A limitation in some graphitic anodes is that Li is saturated in graphite at the $LiC_6$ stoichiometry. Materials that can allow for larger amounts of Li insertion, therefore, have been attractive for use as high capacity Li battery anodes.

Some alternatives to graphite anodes utilize storage mechanisms that do not involve the intercalation of Li ions between layered-structure materials. For example, some transition metal oxides use a conversion mechanism that can provide relatively high energy anodes of 700 mAh/g. Other alternatives include elements, such as Si, Sn, Bi, and Al, which form alloys with Li through Li insertion. Some of these elements provide relatively large theoretical energy capacities. Often such elements exhibit a volume change during Li insertion. For example, pure Si has a theoretical capacity of 4200 mAh/g for $Li_{4.4}Si$, but has been shown to produce as much as a 400% volume change during Li insertion (alloying). In films and micron-sized particles, such volume changes may cause the Si to pulverize and lose contact with the current collector, resulting in capacity fading and short battery lifetime. Electrodes made of thin amorphous Si may exhibit improvements in capacity stability over many cycles, but such films seldom have enough active material for a viable battery. Attempts to increase conductivity using conducting carbon additives have not completely solved such problems, since upon dealloying (delithiation), the particles may contract, and thereby, lose contact with the carbon. Si anodes have been prepared with a polymer binder such as poly(vinylidene fluoride) (PVDF) to attempt to hold the particles together, but the elasticity properties of PVDF may not be sufficient for the large Si volume change and do not completely mitigate the poor conductivity. This results in a low coulombic efficiency and poor cyclability. For example, the use of 10 µm sized Si particles mixed with carbon black and PVDF has been shown to result in a first discharge capacity of 3260 mAh/g; however, the charge capacity is only 1170 mAh/g, indicating a poor coulombic efficiency of only 35%. After 10 cycles, the capacity also faded to 94%. Moreover, conductive additives and binders add weight to the electrode, lowering the overall gravimetric and volumetric capacities of the battery.

These and other characteristics have been challenging to the design, manufacture and use of Li-alloy materials in Li-battery anodes. A solution has been to use nanostructure battery electrode materials. Nanomaterials include nanowires, nanoparticles, and nanotubes, all of which have at least one dimension in the nanometer dimension. Nanomaterials have been of interest for use in Li batteries because they have better accommodation of strain, higher interfacial contact area with the electrolyte, and short path lengths for electron transport. These characteristics may lead to improved cyclability, higher power rates, and improved capacity. Current efforts, however, leave room for improvement.

SUMMARY OF THE INVENTION

The present invention is directed to overcoming the above-mentioned challenges and others related to the types of applications discussed above and in other applications. These and other aspects of the present invention are exemplified in a number of illustrated implementations and applications, some of which are shown in the figures and characterized in the claims section that follows.

Aspects of the present invention are directed towards battery electrodes (and associated methods of use and manufacture) that include crystalline-amorphous nanowires. Specific implementations relate to nanowires with crystalline cores and amorphous shells.

Consistent with one embodiment of the present invention, a method is implemented for producing a battery electrode having nanowires of a first material. The method includes the steps of using a single growth condition to promote growth of crystalline nanowires on a conductive substrate and of the first material and to promote, by maintaining the growth condition, growth of an amorphous portion that surrounds the crystalline nanowires.

According to various aspects of the present invention, a method is creating crystalline-core amorphous-shell nanowires. The method includes promoting growth of crystalline nanowires from a surface material of a substrate, the surface material being a metal-alloy, using catalysts that are intrinsic to the surface material, and promoting growth of an amorphous portion that surrounds the crystalline nanowires.

Consistent with another embodiment of the present invention a device is implemented for use in a battery in which ions are moved. The device includes a conductive substrate; a plurality of nanowires extending from the substrate and each nanowire having a crystalline core of between 2 nm and 1000 nm in thickness, the core extending in a longitudinal direction, and an amorphous shell of between 10 nm and 5000 nm in thickness and surrounding the crystalline core.

According to another implementation of the present invention, a battery-based device is implemented that includes an electrode that includes crystalline-core amorphous-shell nanowires made from a first material; and a control circuit for limiting charge potentials applied to the electrode to a value that is a function of a charge potential at which crystalline structures of the first material undergo amorphization.

Consistent with aspects of the present invention, a method is implemented for use of a battery-based device. The method includes the steps of applying charge potentials to an electrode having crystalline-amorphous nanowire structures, the charge potentials being sufficient to capture ions within an amorphous portion of the crystalline-amorphous nanowire structures; and limiting the charge potentials applied to the electrode to a value that is a function of a charge potential at which crystalline portions of crystalline-amorphous nanowire structures undergo amorphization.

The above summary is not intended to describe each illustrated embodiment or every implementation of the present invention.

BRIEF DESCRIPTION OF THE DRAWINGS

The invention may be more completely understood in consideration of the detailed description of various embodiments of the invention that follows in connection with the accompanying drawings, in which.

While the invention is amenable to various modifications and alternative forms, examples thereof have been shown by way of example in the drawings and will be described in detail. It should be understood, however, that the intention is not to limit the invention to the particular embodiments shown and/or described. On the contrary, the intention is to cover all modifications, equivalents, and alternatives falling within the spirit and scope of the invention.

DETAILED DESCRIPTION

The present invention is believed to be applicable to a variety of different types of ion batteries and devices and arrangements involving crystalline-amorphous nanowire electrodes. While the present invention is not necessarily so limited, various aspects of the invention may be appreciated through a discussion of examples using this context.

Embodiments of the present disclosure relate to nanowires having a crystalline core and an amorphous shell (ca-nanowires). As used herein, crystalline material includes single crystalline material as well as substantially-single crystalline material. Substantially-single crystalline material includes crystalline material that the majority of the material is either part of a single crystalline structure or is generally aligned therewith. As such, substantially-single crystalline material can include a relatively low number of discontinuities, including imperfections and/or few breaks in the crystalline structure. Amorphous material includes material in which the majority of the material is not aligned within a common orientation/lattice structure and instead has a relatively random orientation.

Aspects of the present disclosure relate to the surprising discoveries relating to ca-nanowires including functional properties, uses and manufacturing processes. One such surprising discovery relates to structural rigidity believed to be provided by the crystalline core. Other discoveries relate to the ca-nanowires ability to function within a battery cell. One such aspect relates to uses of ca-nanowires that facilitate the ca-nanowires's ability to maintain structural and functional properties over numerous charge cycles. Yet other aspects of the present disclosure relate to effective manufacturing processes.

A specific implementation of the present invention relates to ca-nanowires made from silicon (Si) or primarily Si.

Consistent with embodiments of the present disclosure, amorphous Si shells can be selected to be electrochemically active (relative to Si crystalline cores) due to the difference of lithiation potentials between amorphous and crystalline structures. Certain aspects use such a crystalline (Si) core as a stable mechanical support and an efficient electrical conducting pathway while amorphous shells store Li+ ions.

Aspects of the present disclosure relate to ca-nanowires having one or more of a charge storage capacity or about ~1000 mAh/g, ~90% capacity retention over 100 cycles, good electrochemical performance at a high rate of charging and discharging (e.g., 6.8 A/g, ~20 times of carbon at 1 h rate).

Consistent with one embodiment of the present invention, a battery is implemented with an anode, a cathode, current collectors contacting the anode and cathode, and an electrolyte. The negative electrode or anode is composed of a plurality of ca-nanowires extending from a substrate. The ca-nanowires have an outer amorphous surface with multiple molecules that interact with the ions and an inner substantially single-crystalline structure. The substrate from which the nanowires extend is attached to (or makes up) a current collector. The material comprising the current collector can include, but is not limited to, stainless steel, copper, nickel, aluminum, and other preferably metallic materials that are inert to Li. The current collector can also be comprised of a flexible material such as plastic that is coated with a layer of metal, such as copper or nickel, in order to make it electronically conducting. In a specific embodiment, the ca-nanowires are grown from the substrate in such a manner so as to produce nanowires with one end of the nanowire in direct contact with the substrate and the other end of the nanowire extending away from the substrate. Other embodiments allow for the ca-nanowires to be grown or fabricated in other manners and then subsequently attached to the substrate.

In connection with another embodiment of the present invention, an arrangement for use in a battery is implemented. The arrangement includes solid ca-nanowires extending from a substrate. The substrate is attached to a current collector. In this fashion, the arrangement can be used as an electrode in the battery.

In connection with another embodiment of the present invention, a battery is implemented with a stable energy capacity. An ion transporter, such as an electrolyte, allows ions to move between electrodes located on either side of the ion transporter. One of the electrodes has a substrate from which a plurality of ca-nanowires extends. These ca-nanowires interact with the ions to set the stable energy capacity. Thus, the battery maintains the energy capacity through several charge and discharge cycles. These ca-nanowires include non-fullerene type nanowires that allow for the diffusion of the ions into the nanowire.

In a specific instance, the diffusion of ions into the ca-nanowire results in the ca-nanowire temporarily being composed of an alloy of the diffused ions and the underlying nanowire material. A specific example of such an alloy is $Li_{4.4}Si$ formed from the diffusion of Li ions into Si-based ca-nanowires. Other examples of potential nanowire materials include Ge and Sn as well as various metal oxides, nitrides, and phosphides, such as $SnO_2$, $TiO_2$, $Co_3O_4$, $Li_{2.6}Co_{0.4}N$, $Li_3N$, $LiMnN$, $FeP_2$, $CuP$, $CoP_3$ and $MnP_4$. Additionally, the ca-nanowires may be constructed to contain an alloy of these materials with another material, for example a Si—Ge alloy or a Si—Sn alloy. Particular implementations relate to mechanisms for controlling the diffusion of Li ions into the Si ca-nanowires to contain the diffusion primarily to the amorphous portion. Other implementations relate to mechanisms for controlling Li interaction with the crystalline core so as to preserve the crystalline structure of the crystalline core. This can be particularly useful for preventing the crystalline portion from being degraded by Li ion diffusion as can occur due to the formation of the crystalline Li15Si4 phase4.

Embodiments of the present invention also relate to ca-nanowires constructed from multiple materials. For example, C—Si, Si—Ge, Si—Sn core-shell/crystalline-amorphous nanowires, or other core-shell designs are possible by growing a crystalline nanowire from a first material. An amorphous shell is then created from a second material.

Consistent with another embodiment of the present invention, a method of producing a battery arrangement is implemented. Nanowires are grown directly on a current collector substrate thereby making direct electronic contact between the nanowires and the current collector. A few methods by which this can be done include using vapor-liquid-solid (VLS) or vapor-solid (VS) growth methods.

In a specific example, Si nanowires are synthesized using $SiH_4$ decomposition. The substrate for the growth may be a suitable conductor, such as a metallic material, or more particularly, a stainless steel 304 foil. Embodiments allow for the use of catalysts, such as gold, that are deposited on the current collector substrate provided either from colloid solution or by depositing a thin film of Au using e-beam evaporation or sputtering. Alternatively, nanowires can be grown on a substrate using template-free solution phase methods, including but not limited to solution-liquid-solid (SLS) growth, solvothermal, hydrothermal, sol-gel, and supercritical fluid-liquid-solid (SFLS).

Surprisingly, aspects of the present disclosure recognize that ca-nanowires can be grown from a substrate without the use of catalysts.

The resulting ca-nanowires may exhibit diameters that range in size and that are specifically tailored to an application. Careful selection of the diameter can be accomplished by balancing a number of factors. For example, nanowires having suitable small diameters may be less susceptible to dissociation from the substrate due to ion-insertion (or deinsertion) strain. Such strain may result in dissociation of the nanowires from the current collector (e.g., due to pulverization of the material), resulting in a reduction of the energy capacity. Larger diameters may increase the total volume of nanowire material on the substrate; however, larger diameters may result in the ions not fully diffusing into the center of the nanowire. Such failure to fully diffuse may result in a corresponding decrease in the energy capacity per gram of the nanowires because a portion of the nanowire has not been used. These and other factors may be used to determine the optimal nanowire size.

Some of the various nanowire arrangements and methods discussed herein may be particularly useful for providing nanowires that are substantially all directly connected with the metallic current collector. Such connected nanowires contribute directly to the capacity without the use of intervening conductive material. These connected nanowires may also be constructed so as to withstand volumetric changes exhibited during the cycling of the battery. Thus, some arrangements and growth methods may be useful for avoiding the use of binders or conducting additives, which can add extra weight and lower the overall capacity of the battery. Moreover, some nanowires allow for direct (1 dimensional) electron pathways along the length of the wire to the current collector. This may be particularly useful for efficient charge transport to the current collector. In one instance, this electrode is used as the anode, or negative electrode, of the battery.

In a particular embodiment of the present invention, the positive electrode, or cathode, may contain an electrode that is similar to the anode in that it has a plurality of nanowires extending from a current collector substrate. These nanowires can be grown using the vapor phase and template-free solution phase methods previously mentioned. Alternatively, the cathode may be composed of powder composite materials that are presently used in a Li-ion battery. While the present invention is not limited to such examples, a few examples of commercially available cathode materials are $LiCoO_2$, $LiFePO_4$, $LiMnO_2$, $LiMn_2O_4$, and $LiNiO_2$. Between the two electrodes is an ionically conducting, electronically insulating region that includes an electrolyte facilitating transport of ions between the electrodes. This region includes a membrane separator soaked with electrolyte, the electrolyte being a Li salt dissolved in an organic solvent, for example, 1 M $LiPF_6$ in 1:1 w/w ethylene carbonate: diethyl carbonate. Alternatively, the electrolyte can be a Li salt mixed with a solid ionically conducting material such as a polymer or inorganic material.

According to various example embodiments of the present invention, ca-nanowires grown from the substrate exhibit a core crystalline structure with an amorophous shell. Charge and discharge cycles are controlled to maintain the crystalline state of the core, which can occur due to the insertion of the ions into the molecular structure of the ca-nanowires, thereby disrupting the crystalline structure.

The ca-nanowires can also be grown so as to have relatively short ion (e.g., Li) diffusion pathways. In some instances, a 1-dimensional electron pathway is exploited by growing the nanowires directly on the current collector substrate, thereby electrically addressing each nanowire and allowing for continuous electron transport pathways down the length of each nanowire.

Figure 1A:
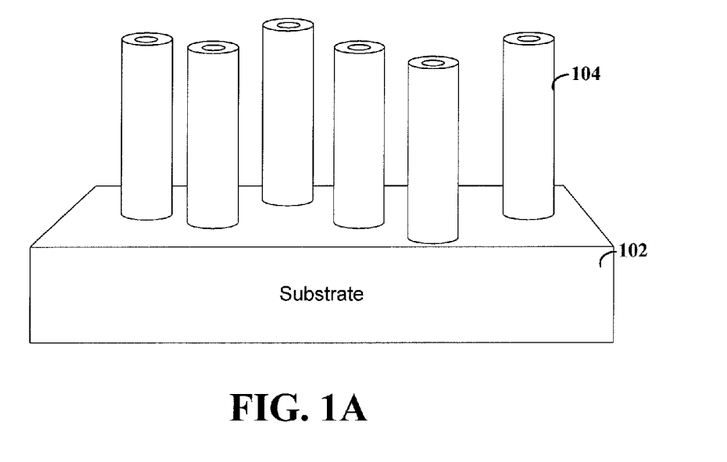
FIG. 1A shows an apparatus for use in a battery in which ions are moved, consistent with an embodiment of the present invention.
Figure 1B:
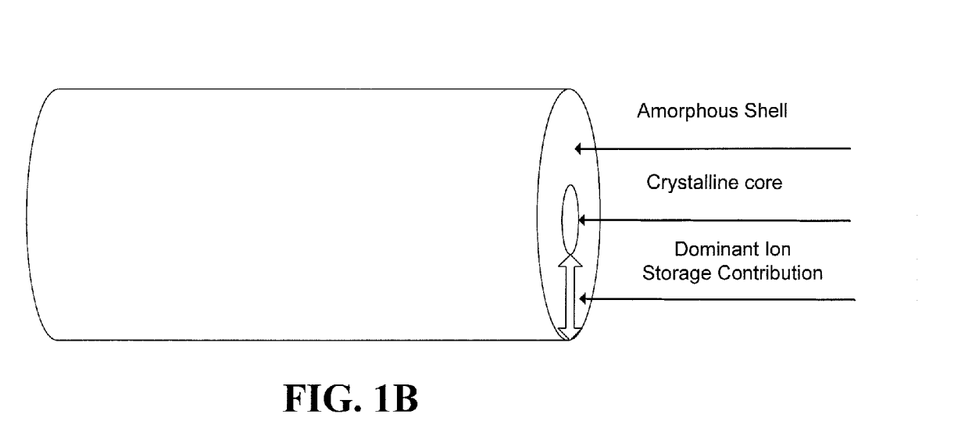
FIG. 1B shows the ca-nanowires having a crystalline core surrounded by an amorphous shell, consistent with an embodiment of the present invention.

Turning now to the figures, FIG. 1A shows an apparatus for use in a battery in which ions are moved, according to one embodiment of the present invention. Ca-nanowires 104 extend from substrate 102 and are adapted to interact with ions during charging and discharging of the battery. As shown in more detail in FIG. 1B, the ca-nanowires 104 include a crystalline core surrounded by an amorphous shell. In certain embodiments, the amorphous shell is the dominant contributor to the ion storage capacity of the nanowire (relative to ion storage contributed by the crystalline portion). In particular implementations, the charge-discharge cycles are controlled to either limit the ion diffusion to the amorphous shell or to limit ion interaction with the crystalline core to interactions that maintain the crystalline structure of the core. The crystalline-to-amorphous transition point can be determined for the nanowires and used to control charge-discharge cycles.

In one instance, ca-nanowires 104 are non-fullerene nanowires growth rooted from substrate 102; however, other embodiments are also possible. Rather than using intercalation into a layered material, such as single-walled nanotubes (SWNT) and multi-walled nanotubes (MWNT) made from carbon, the non-fullerene nanowires use an alloying mechanism to interact with the ions. This can be particularly useful for providing a high-energy-capacity battery.

The ca-nanowires 104 can be constructed from various materials that interact appropriately with the ions (e.g., store ions during charge and release ions during discharge). A specific embodiment uses Si as the primary nanowire material.

Figure 2A:
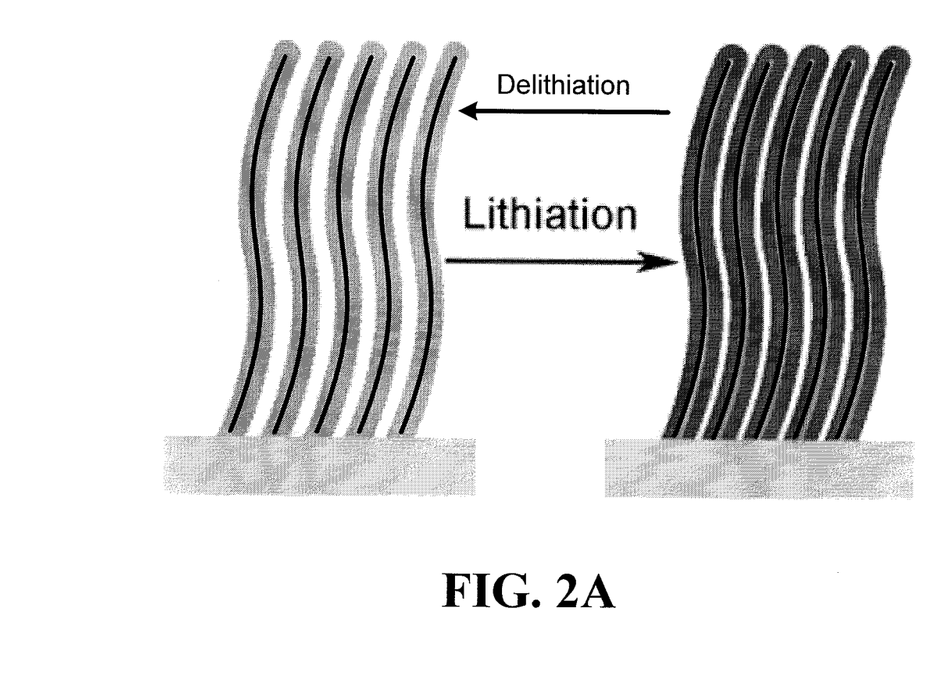
FIG. 2A shows an electrode having ca-nanowires before (left) and after (right) lithiation, according to an embodiment of the present invention.

FIG. 2A shows an electrode having ca-nanowires before (left) and after (right) lithiation, according to an embodiment of the present invention. The ca-nanowires on the left are comprised primarily of a first-material (e.g., Si) with the central core being substantially-single crystalline and the surrounding shell being amorphous. When charged, the ca-nanowires store Li ions and can undergo a size change. Surprisingly, the ca-nanowires can undergo repeated lithiation/delithiation steps while maintaining the crystalline core. More specifically, by limiting the charging potential, the amorphous shell material for Li+ can be used for storage while preserving the crystalline core. The crystalline core can provide mechanical support and efficient electron transport pathways.

Figure 2B:
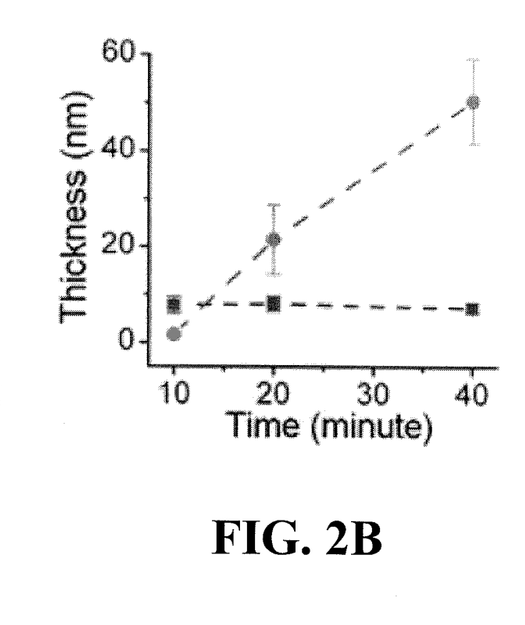
FIG. 2B shows the statistics of the core radius and shell thickness versus growth time for a Si nanowire fabrication, consistent with an embodiment of the present invention.

FIG. 2B shows the statistics of the core radius and shell thickness versus growth time for a Si nanowire fabricated consistent with an experimental process of the present disclosure. One such process involves growth of ca-core-shell Si nanowires using a single growth condition. As used herein a single growth condition includes maintaining temperature, pressure and flow at relatively stable conditions throughout the nanowire growth process. Minor variations in these conditions are still possible; however, it has been discovered that the growth of crystalling and amorphous portions can be surprisingly possible without the use of clearly defined and distinct growth conditions.

Figure 6:
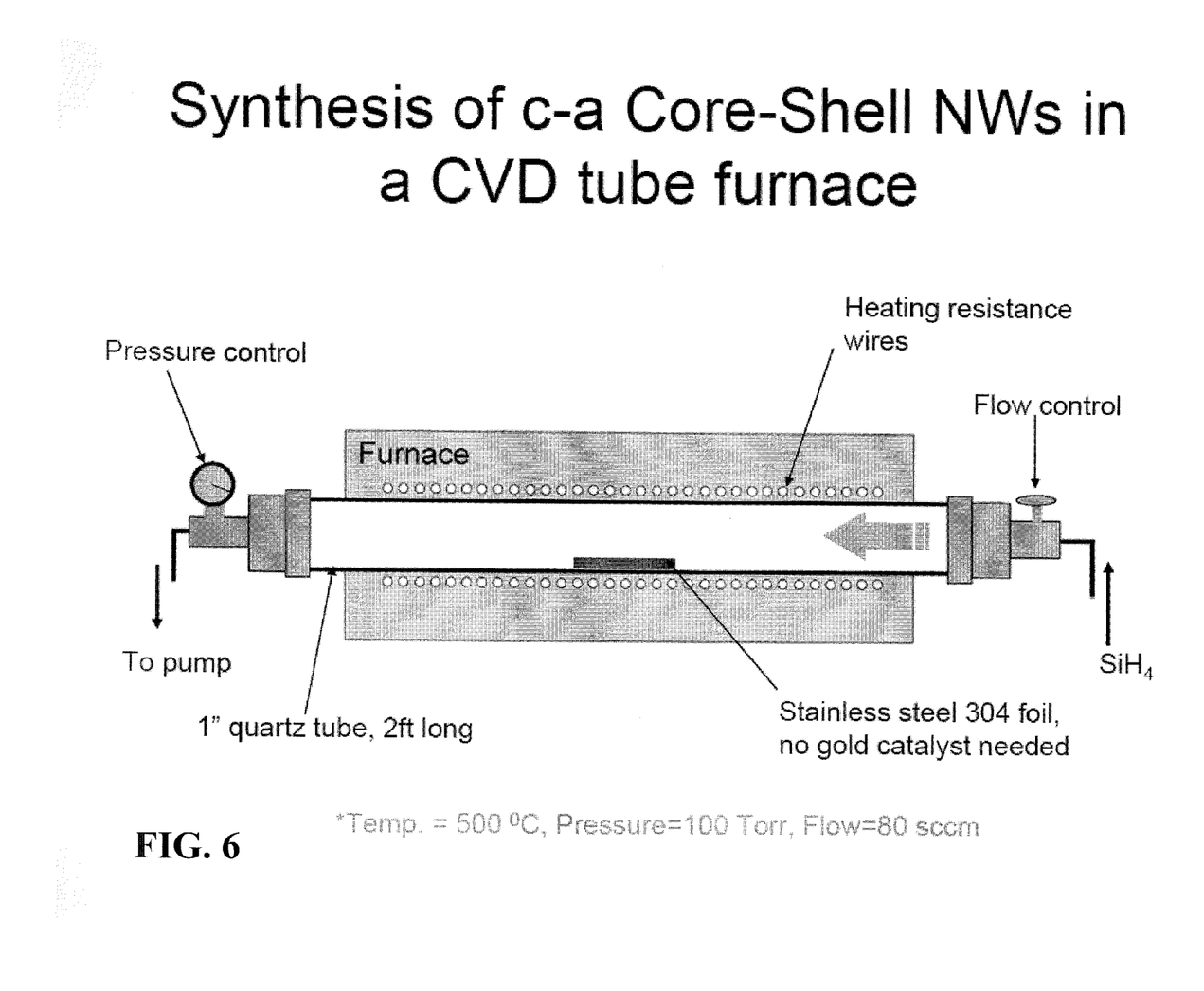
FIG. 6 depicts a SiH4 CVD furnace and associated parameters, consistent with an embodiment of the present invention.

In a particular experimental implementation, growth was conducted directly on stainless steel (SS) current collectors without applying a catalyst (e.g., Au) in a SiH4 CVD furnace. In particular implementations, large flows, high pressure, and high temperatures facilitate the yield of ca-core-shell Si nanowires on SS substrates. A particular implementation of such a furnace is depicted in FIG. 6. Without being bound by theory, it is believed that transition metals in SS, such as Fe, Ni, or Cr, catalyze the growth by a direct vapor-solid (VS) mechanism since Fe and Ni have previously been known to catalyze this kind of growth.

Embodiments of the present invention relate to modifications to the substrate. For instance, modifications to the substrate can be implemented to control the density of nanowires created therefrom. One such modification includes roughening (e.g., increasing the surface area) of the (stainless steel) substrate to increase the density of nanowires. The specific type of stainless steel can also be tailored to obtain a desired nanowire growth parameter. For instance, a substrate having high content of transition metals (e.g., Fe, Ni, or Cr) can be used to increase the density of potential nanowire-growth catalyst locations. This can lead to an increased density of nanowires.

Transmission electron microscopy (TEM) images and selected area electron diffraction (SAED) patterns of Si nanowires grown at 485° C. for different growth times were taken. For 10 min of growth, the nanowires were mostly single crystalline with little amorphous shell. For 20 min, a thick layer of amorphous shell was observed, which became even thicker for a 40 min growth. As shown in FIG. 2B, the thickness of amorphous shell increased linearly with growth time while the core radius does not change. This suggests that c-Si cores were grown first and a-Si was subsequently coated onto the cores from SiH4 decomposition. To confirm the amorphous shell is Si instead of SiO2, energy dispersive X-ray spectroscopy (EDX) measurements were taken. The measurements showed a dominantly Si signal with only a trace amount of oxygen.

The amorphous shell is selectively used for Li+ ion storage and the crystalline core is not so used. Thus, the percentage weight of amorphous Si to crystalline Si in the nanowires affects the efficiency thereof. For the ca-nanowires grown for 40 min, the a-Si shells account for 98-99% by volume or weight. Accordingly, various experimental implementations discussed hereafter use such ca-nanowires.

Consistent with another embodiment of the present invention, crystalline nanowires are grown from an electrode. An outer portion of the crystalline structure is lithiated so as to produce an outer amorphous shell surrounding the remaining crystalline core. Subsequent lithiation/charge cycles are controlled so as to maintain the remaining crystalline core.

Other embodiments allow for a combination of a single-growth condition method that generates ca-nanowire structures with partial lithiation of a portion of the crystalline structure. This can be particularly useful for controlling the ratio of crystalline to amorphous in the nanowires. For instance, the crystalline portion of the nanowires does not significantly contribute to the storage potential of the device. Accordingly, it may be desirable to reduce the crystalline portion while at the same time increasing the amorphous portion by partial lithiation of the crystalline portion. In this manner a balance can be made between the beneficial properties of the crystalline core (e.g., structural integrity or conductive properties) and the amount of the amorphous portion.

Figure 3:
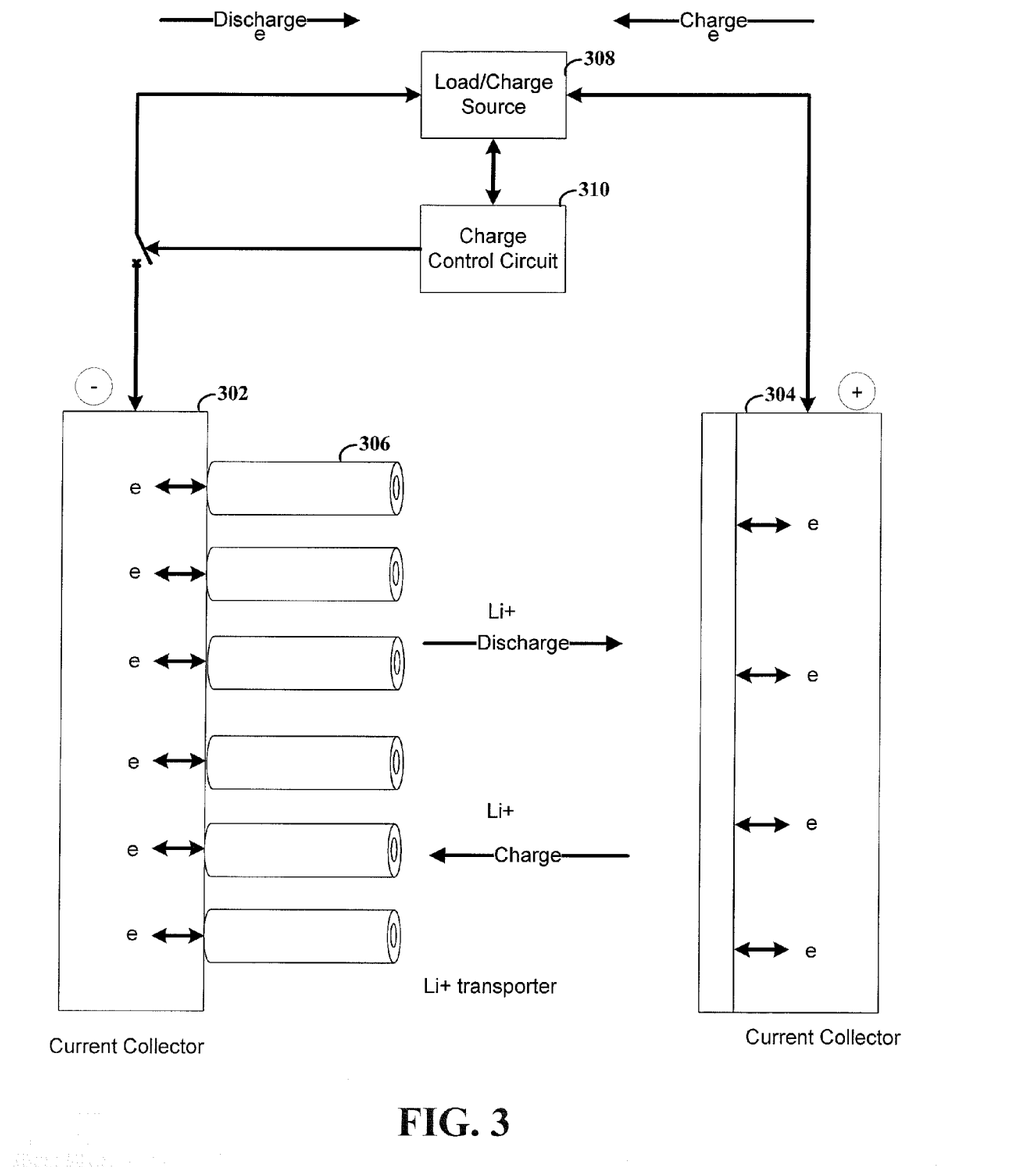
FIG. 3 shows the functionality of a lithium-ion battery cell having ca-nanowires on the current collector anode, according to an example embodiment of the present invention.

FIG. 3 shows the functionality of a lithium-ion battery cell having ca-nanowires on the current collector anode, according to an example embodiment of the present invention. Current collectors 302 and 304 provide an interface from the load/charge 308 to both the anodal ca-nanowires 306 and the cathode 304. In a particular embodiment, cathode portions 304 can be constructed from nanostructures; the invention, however, is not limited to such an embodiment. The anodal ca-nanowires 306 receive and accept with $Li^+$ ions during a charge state, for example by alloying. Such a charge state is implemented by application of an appropriate voltage to current collectors 302 and 304. Energy from the applied voltage is stored, for example, in the form of a nanowire-Li alloy. Cathode portions 306 release $Li^+$ ions during the charge state. In a specific example, the cathode is a metal oxide (e.g., $LiCoO_2$) that changes its oxidation charge during the charge state. For instance, in the case of $LiCoO_2$, the charge state is a higher oxidation state than the discharge state, where $Co^{3+}$ oxidizes to $Co^{4+}$ releasing a $Li^+$ ion to the electrolyte. Thus, more ions are free to react with the anodal nanowires during the charge state.

In particular implementations, the Li alloying is limited to the amorphous portion of the ca-nanowires and/or limited to a value that otherwise maintains the crystalline portion of the ca-nanowires. This can be facilitated using a charge control circuit 310, which can be used to limit the charge potential of the battery. For instance, the charge control circuit 310 can impose a final charging voltage limit of a full cell that is equal to the cathode charging limit subtracted by a charge cutoff value. For instance, experimental embodiments discussed herein show that imposing a 150 mV charge cutoff can be effective to maintaining the crystalline portion. The charge cutoff is not necessarily limited to this value. Changes to operating parameters can result in different charge cutoff values being effective. For instance, the operating temperature can affect the reaction point of the crystalline material. Modifications to the ca-nanowire dimensions and composition can also have an effect on the cutoff level. Various other factors can also play a role in setting the desired cutoff level.

The Li+ ions can be part of an electrolyte that is located in the area between the anode and cathode. This allows the Li+ ions freedom to move between the anode and cathode during either of the charge and discharge states. In one instance, a porous separator layer is used to provide structural support between the anode and cathode, while still allowing for the movement of Li+ ions therebetween. Specific embodiments of the present invention implement a battery using an electrolyte that has Li salt dissolved in an organic solvent. A specific example is 1.0 M $LiPF_6$ in 1:1 w/w ethylene carbonate: diethyl carbonate. The electrolyte can also be a Li salt dissolved with a polymer or inorganic material.

Consistent with an embodiment of the present disclosure, the structure of a battery cell can be assembled by forming an electrode arrangement that has an ion transporter located between the current collectors of the anode and cathode. One of the anode and cathode includes a substrate that has solid ca-nanowires grown therefrom. This structure can then be surrounded by a suitable housing, such as an insulating material with at least two conductive terminals. One terminal is used to electrically connect to the anode portion of the structure, while another terminal is electrically connected to the cathode portion of the structure. In a specific embodiment, the structure can be shaped to conform to form factors of commercially available batteries.

Figure 4:
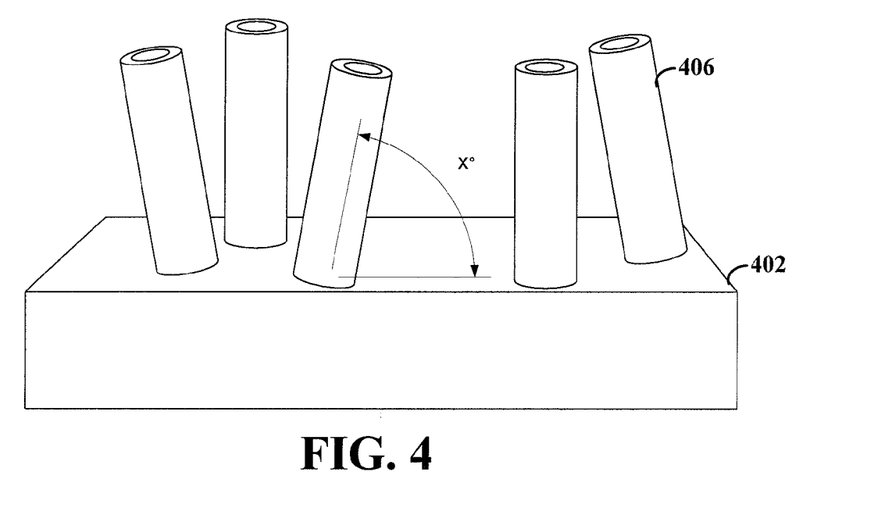
FIG. 4 shows orientation of ca-nanowires relative to a substrate, consistent with an embodiment of the present invention.

FIG. 4 shows orientation of ca-nanowires relative to a substrate, consistent with an embodiment of the present invention. In particular, FIG. 4 shows ca-nanowires 406 extending from substrate 402. In a specific embodiment the nanowires are on the order of tens of microns in length and between 2 nm and 1000 nm in diameter prior to a charge-discharge stage. Due to the process of growth, a majority of the nanowires may exhibit a substantially vertical growth from substrate. This may be characterized in a specific example where the majority of the nanowires have an angle greater than about 50 degrees from the substrate as shown by angle X.

Turning now to one experimental implementation, ca-core-shell nanowires were assembled into half-cells with Li metal as counter electrode. No binders or conducting carbon were used. The half-cells were studied using electrochemical potential spectroscopy (EPS) and galvanostatic charge/discharge. In EPS measurement, a series of constant potential steps were applied to the electrochemical cell. On each step the cell was permitted to attain quasi equilibrium conditions by letting the current decay to a small but finite value (0.05 C, typically ~40 mA/g in our measurements). Small voltage steps (5 mV) were applied, and the charge accumulated on each step was integrated from the measured current to yield an accurate derivative of the voltage-charge relation. This derivative relation can be a useful tool for understanding the structural transition inside electrode materials. Under a thermodynamic equilibrium condition the potential/composition profile obeys Gibbs phase rule, that is, the potential is constant in a two-phase region but changes linearly in single-phase domain. So, the first derivative of quasi equilibrium charge/voltage curve can show sharp peaks for two-phase regions or bell-like peaks for single-phase regions, revealing whether a phase transformation occurs.

Figure 5A:
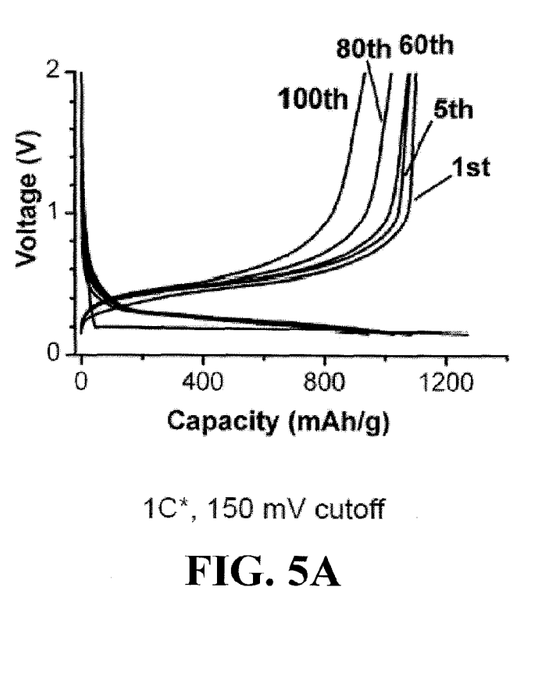
FIG. 5A shows voltage profiles for ca-nanowires over a number of charge cycles, consistent with an embodiment of the present invention.

FIG. 5A shows voltage profiles for ca-nanowires over a number of charge cycles, consistent with an embodiment of the present invention. The charge cycles were conducted at 1 C using 150 mV cutoff. As shown in the figure, the capacity maintained consistently even through 100 charge cycles.

Figure 5B:
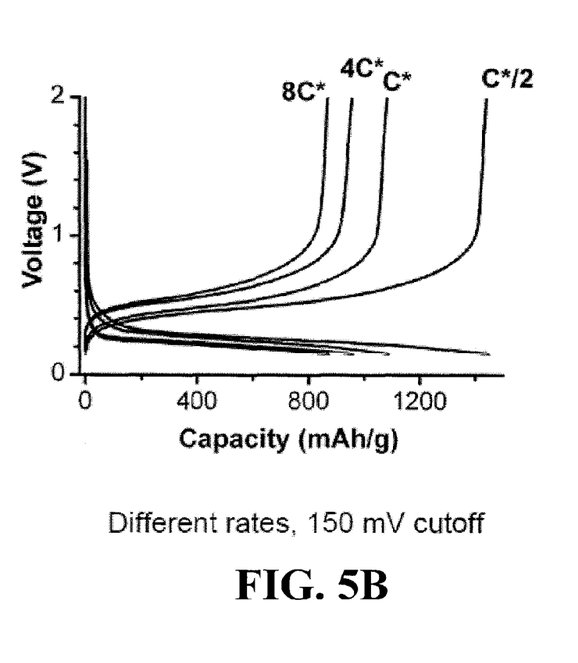
FIG. 5B shows voltage profiles for ca-nanowires over different charge rates, consistent with an embodiment of the present invention.

FIG. 5B shows voltage profiles for ca-nanowires over different charge rates, consistent with an embodiment of the present invention. The charge rates ranged from C/2 to 8 C and show robust capacity across the various charge rates.

Figure 7:
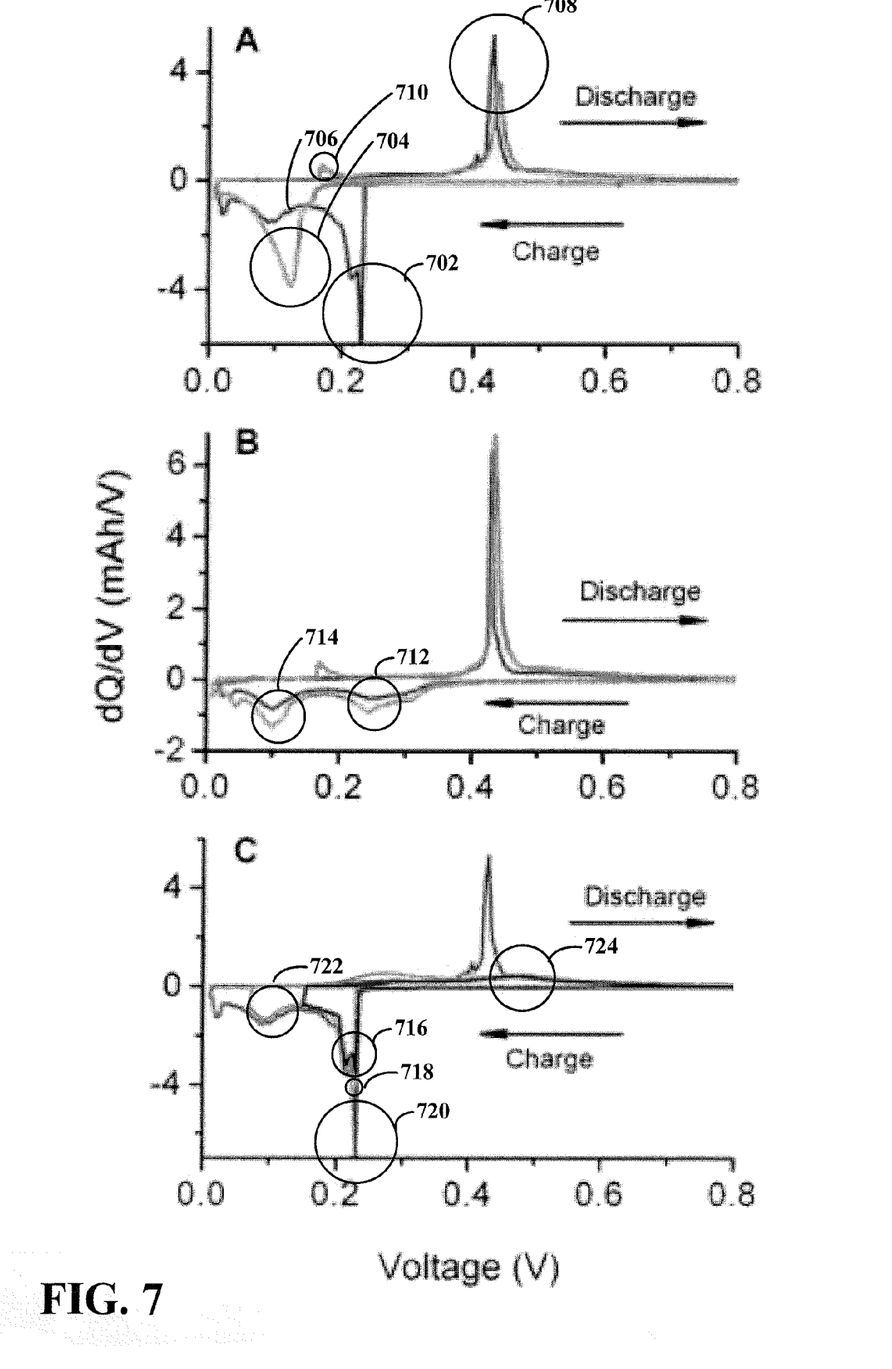
FIG. 7A shows experimental results of EPS for a first charge cycle of ca-nanowires, consistent with an embodiment of the present invention.
FIG. 7B shows experimental results of EPS for a second charge cycle of ca-nanowires, consistent with an embodiment of the present invention.
FIG. 7C shows experimental tests were implemented to study the behavioral change when using different cutoffs, consistent with an embodiment of the present invention.

EPS was performed to study the behaviors of ca-nanowires for the first and second cycles, which were compared with c-nanowires grown by an Au-catalyzed VLS method. For further details on such a method reference can be made to "High-performance lithium battery anodes using silicon nanowires," Chan et al., $Nat.$ $Nanotechnol.$ 2008, 3, 31-35, which is fully incorporated herein by reference. The potential was stepped from 2 to 0.01 V during the first charge cycle (FIG. 7A lower parts of the curves). As shown in FIG. 7A, there is a sharp peak 702 at 230 mV for ca-nanowires but not for c-nanowires. This suggests that the peak is due to the lithiation of the a-Si shell. The sharpness of this peak indicates the coexistence of two-phase structure of partially lithiated a-Si and unlithiated a-Si. This sharp peak also agrees with previous thin film studies on a-Si. At the potential range of 150-70 mV, the c-nanowires show a sharp peak 704 at 120 mV while the ca-nanowires show a bell-like peak 706 at a shifted potential of 100 mV. The sharp peak at 120 mV for c-nanowires is attributed to the amorphization of c-Si during the first lithiation process. For the ca-nanowires at 150-70 mV, lithiation of amorphous LixSi shell should be continued and also be accompanied by the amorphization of c-Si core. The percentage of crystalline core material is believed to be too little (1-2 wt %) to contribute to the peak at 150-70 mV. Instead the peak is attributed to the further single-phase lithiation of amorphous LixSi shell, which explains its bell shape and shifted position.

For both ca- and c-nanowires, further charging results in the formation of a new phase from amorphous LixSi at the peak potential of 40 mV. This new phase is believed to be due to crystalline Li15Si4, which was suggested by a previous study on Si powders and films. Upon discharge (FIG. 7A upper parts of the curves), both ca- and c-nanowires show a sharp peak 708 at 450 mV, indicating a transformation via coexistence of two phases of crystalline Li15Si4 and amorphous LixSi. The small peak 710 at 170 mV (FIG. 7A, upper parts of the curves) for c-nanowires is believed to be due to the delithiation of Au catalyst nanoparticles from the VLS growth, whose contribution is little and can be neglected.

After the first cycle of charge and discharge between 2-0.01 V, both ca- and c-nanowires turn into amorphous LixSi phase where x is very small. During the second cycle between 2.00-0.01V (FIG. 7B), ca-nanowires and c-nanowires show similar behaviors. The two bell-shaped peaks 712 and 714 (250 mV and 100 mV, respectively) during charge (FIG. 7B, lower parts of the curves) are believed to be due to the lithiation of single-phase amorphous LixSi but with different site energies in the structure.

Aspects of the present disclosure relate to cycling only the amorphous shell by maintaining the charge cutoff potential above the potential for amorphization of c-Si (e.g., ~120 mV). Experimental tests were implemented to study the behavioral change when using different cutoffs. These tests included a comparison of three ca-NW half-cells using EPS at the low-voltage cutoffs of 10 mV, 70 mV, and 150 mV as shown in FIG. 7C. Limiting the charge voltage above 70 mV is believed to prevent the formation of the crystalline Li15Si4 phase4 and the successive discharge occurs in two single-phase regions shown by the two bell shape peaks (FIG. 7C, 718, 722) although the crystalline core can still be lithiated since the cutoff voltage is below 120 mV. With charge cutoff at 150 mV, the discharge happened mostly in just one single-phase region which corresponds to the broad bell-shape peak 724 at 500 mV (FIG. 7C). In this case, the reaction is believed to involve just the external amorphous shell of the nanowires and preserves the c-Si core for mechanical supports and efficient conductive pathways.

Figure 8:
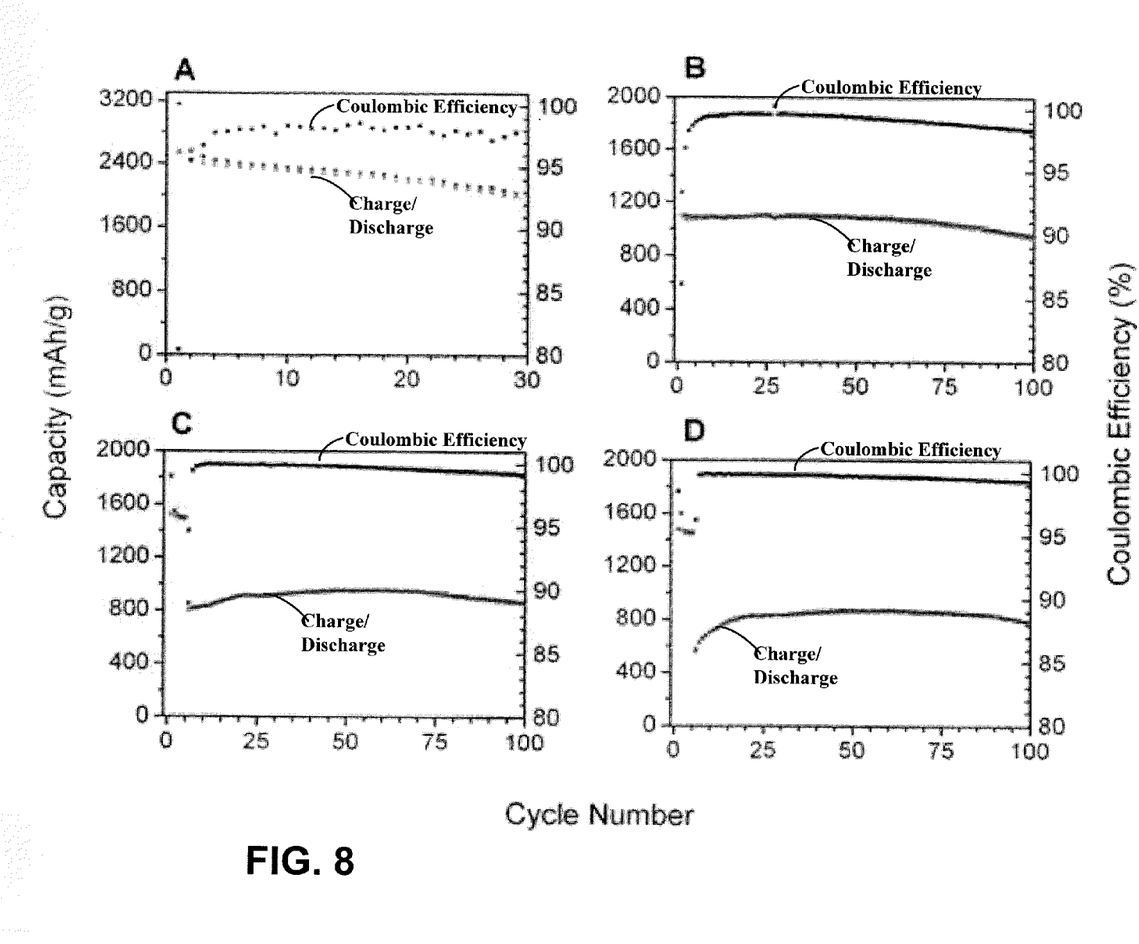
FIG. 8A shows galvanostatic charge/discharge was compared for ca-core-shell nanowires with 10 mV cutoffs, consistent with an embodiment of the present invention.
FIG. 8B shows galvanostatic charge/discharge was compared for ca-core-shell nanowires with 150 mV cutoffs, consistent with an embodiment of the present invention.
FIG. 8C shows the cycling performance of ca-core-shell nanowires using a cutoff of 150 mV at higher power rates including the cycling performance of ca-NW electrode at 0.8 C (3.4 A/g) rate till 100th cycle after operated at 0.1 C rate for five cycles, consistent with an embodiment of the present invention.
FIG. 8D shows the cycling performance of ca-core-shell nanowires using a cutoff of 150 mV at higher power rates including a rate of 1.6 C (6.8 A/g) rate till 100th cycle, consistent with an embodiment of the present invention.

The galvanostatic charge/discharge was compared for ca-core-shell nanowires with 10 and 150 mV cutoffs. When a 10 mV cutoff was used, the whole NW would react with lithium to go through ca-phase transformation repeatedly and fatigue would occur. In FIG. 8A, with a 10 mV cutoff and a current density of 0.85 A/g (0.2 C according to the theoretical capacity of Si), the ca-core-shell nanowires only retain 79% of the first discharge capacity after 30 cycles. The Coulombic efficiency is 80.4% for the first cycle and ~98% between 5-30 cycles. In contrast, ca-core-shell nanowires with a 150 mV cutoff and the same current density show improvement of cycle life (FIG. 8B). The ca-NW electrode was charged to 150 mV in 1.2 h, showing a capacity of ~1060 mAh/g with 85% discharge capacity retention over 100 cycles. Despite the discharge capacity of 150 mV cutoff being lower than that (2500 mAh/g) of 10 mV cutoff, the value is 3 times of carbon. In addition, the Coulombic efficiency (86.2% for the first cycle, 99-99.7% for cycles 5-70, 98.4-99% for cycle 70-100) is higher for the 150 mV cutoff, which suggests little fatigue of nanowires during cycling.

A good mechanical support and efficient electron pathways in ca-core-shell nanowires can also provide the opportunity for large current charge/discharge. FIGS. 8C, 8D show the cycling performance of ca-core-shell nanowires using a cutoff of 150 mV at higher power rates. FIG. 8C shows the cycling performance of ca-NW electrode at 0.8 C (3.4 A/g) rate till 100th cycle after operated at 0.1 C rate for five cycles. Smaller rate of 0.1 C was used at the beginning to condition the ca-nanowires and expand the amorphous shell slowly. The discharge capacity at 0.8 C starts with 807 mAh/g with a high Coulombic efficiency of 95%. The capacity increased gradually to 910 mAh/g at 20th cycle and retained 860 mAh/g after 100 cycles with little fading. The Coulombic efficiency (99.2-99.9%) is high even with the fast 0.8 C rate. FIG. 8D shows the cycling performance of a NW electrode at an even higher rate of 1.6 C (6.8 A/g) rate till 100th cycle. The capacity maintained a high value of ~800 mAh/g and showed little fading after 100 cycles. High Coulombic efficiencies (99.3-99.9%) were observed as well. The charge/discharge times for the Si NW anode at the 1.6 C rate were 7 min. This surprising time is believed to be due to the significantly lower capacity compared to the theoretical capacity of Si. The actual specific current density is high, equivalent to ~2 min charge/discharge rate in graphite anode.

The morphology and structure of cycled ca-nanowires (delithiated at the end of cycling) were investigated using a scanning electron microscopy (SEM) and TEM. The experimental results support that the ca-core-shell structure remained for robust mechanical and electrical support after cycling. Two samples were cycled with 150 and 10 mV cutoffs. The SEM image of the ca-core-shell nanowires after 15 cycles using a 150 mV cutoff showed that the nanowires apparently maintain good wire shapes. The TEM image of a corresponding single NW showed a core-shell structure. SAED pattern confirmed that the core is still crystalline Si. A bright and dark contrast of crystalline Si core was noted, which might be caused by the straining effect of the expansion of amorphous shell during lithium insertion. The SEM image of the ca-core-shell nanowires after 3 cycles using a cutoff of 10 mV and the TEM image and SAED pattern (inset) of corresponding nanowires, indicated an amorphous structure without a crystalline core. This is consistent with other experimental results that suggest that the crystalline core would react with lithium at 10 mV and thereby become totally amorphous upon cycling.

Figure 9A:
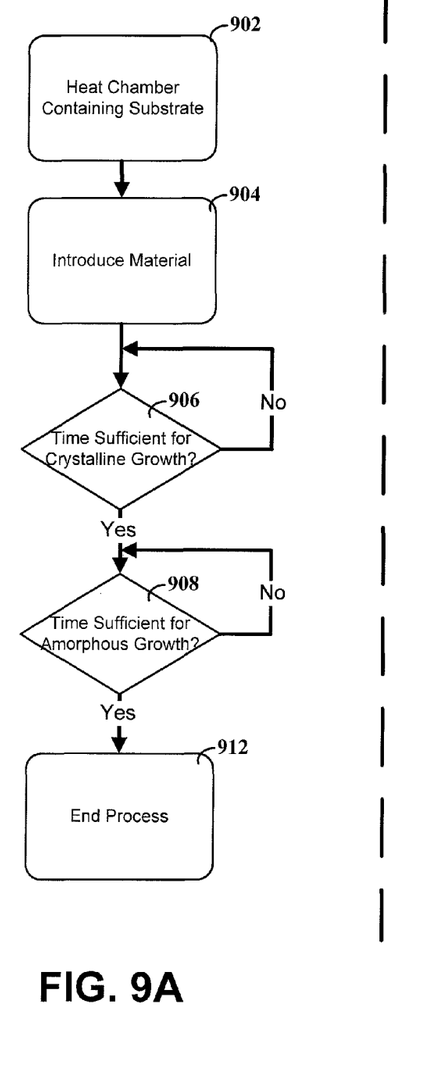
FIG. 9A shows a flow diagram for generating ca-core-shell nanowires, consistent with an embodiment of the present invention.

FIG. 9A depicts flow diagrams for generating ca-core-shell nanowires and for usage thereof, consistent with embodiments of the present invention. At step 902 a chamber containing the substrate is heated to a desired temperature. In particular implementations the temperature is about 485° C.; however the temperature can be within a range of 300° C. to 700° C. and further modified by adjusting of other parameters, such as the pressure of the chamber. For instance, at a temperature of around 485° C. a pressure of about 40 Torr, has been shown to be effective in producing silicon ca-nanowires.

At step 904, the nanowire material is introduced to promote growth of nanowires therefrom. For a silicon-based nanowire material, the silicon can be introduced in the foam of $SiH_4$. While not bounded by theory, it is believed that crystalline nanowires are first grown from catalyst particles of the substrate. After a certain amount of time (e.g., around 10 minutes under certain conditions) an amorphous portion begins to form around the crystalline nanowire portion. It is believed that the amorphous portion is coated onto the cores from $SiH_4$ decomposition. Accordingly, the process involves maintaining the growth conditions for a time period that is sufficient for the formation of crystalline nanowires 906 and then for a time period that is sufficient for the formation of surrounding amorphous growth 908. After this, the growth time is ended 912.

Figure 9B:
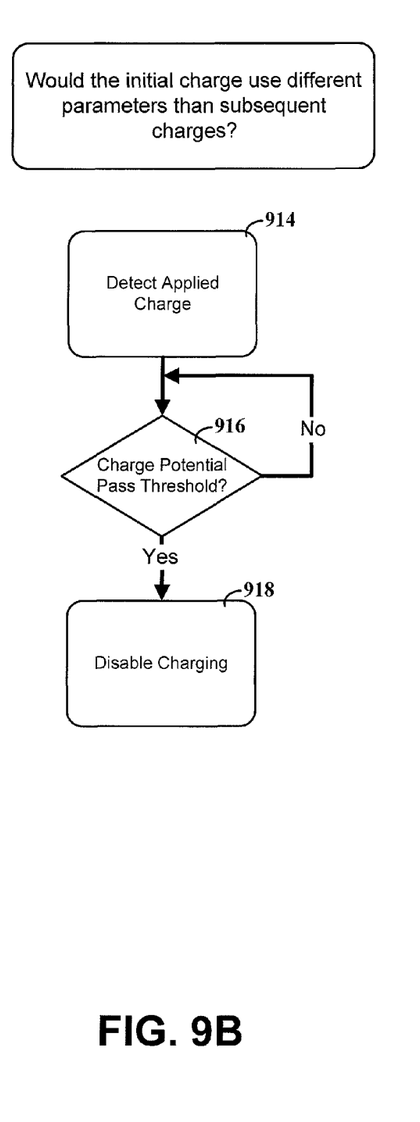
FIG. 9B shows a flow diagram for usage of a battery cell that includes ca-core-shell nanowires, consistent with an embodiment of the present invention.

FIG. 9B shows a flow diagram for usage of a battery cell that includes ca-core-shell nanowires, consistent with an embodiment of the present invention. During discharge/charge cycling, a control circuit implements limits on the cycling to maintain the crystalline portion of the ca-nanowires. At step 914, a charge voltage is applied to the battery cell. This starts the process of ions interacting with and being stored within the amorphous portion of the ca-core-shell nanowires. The charging continues until a charge potential passes a threshold value 916, after which, the charging is disabled 918. The threshold value is set to value that helps preserve the crystalline portion of the ca-core-shell nanowires. This value is based, in part, upon the recognition that the crystalline portion undergoes a reaction at a different potential than that of the amorphous portion. As such, the ca-core-shell nanowires can be repeatedly cycled while maintaining the crystalline core.

Although many of the preceding example embodiments relate to ca-nanowires, the concept can be extended to various nanoparticles (e.g., rods, spheres or cubes). These nanoparticles can also be implemented using a ca-structure. For instance, nanoparticles can be formed and then partially lithiated to form an outer amorphous portion. Alternatively, the amorphous portion can be created in a manner similar to the single-growth methods discussed herein. Combinations of these methods are also possible. The crystalline portions can then be maintained by control of the charge potential.

These and other aspects can be implemented in connection with a variety of different cell and battery devices and configurations. According to one embodiment of the present invention, the current collectors are arranged as parallel sheets separated by the ion source. In other embodiments the current collectors can be arranged in various orientations. For instance, the current collectors may be arranged in a concentric, cylindrical fashion. This can be particularly useful for creating batteries that have a similar form factor to current battery technologies, such as C, AA or AAA cell-sized batteries. In another instance, a plurality of battery cells, each having respective anode, cathode and ion sources, may be arranged in series and/or parallel configuration to form a single battery with the desired capacity and voltage characteristics.

While the present invention has been described above and in the claims that follow, those skilled in the art will recognize that many changes may be made thereto without departing from the spirit and scope of the present invention. Such changes may include, for example, the use of a number of different alloy combinations for the nanowires. In addition, the batteries may be constructed using a plurality of cells, each containing a current collector with nanowires for interacting with the ions. These and other approaches as described in the contemplated claims below characterize aspects of the present invention.

What is claimed is:

1. A method for producing a battery electrode having nanowires of a first material, the method comprising: using a single growth condition to, promote growth of crystalline nanowires, of the first material, on a substrate that is an electrical conductor, and promote, by maintaining the single growth condition, growth of an amorphous portion that surrounds the crystalline nanowires and that is predominantly made from the first material in an amorphous state, each of the first material and the amorphous portion that surrounds the crystalline nanowires being predominantly silicon and not an oxide.

2. The method of claim 1, wherein using the single growth condition to promote growth of the crystalline nanowires and to promote growth of the amorphous portion includes forming a battery electrode that is at least 98% amorphous silicon by weight.

3. The method of claim 1, wherein the single growth condition includes a substantially constant temperature and flow during promotion of growth of both the crystalline nanowires and the amorphous portion that surrounds the crystalline nanowires.

4. The method of claim 1, wherein the single growth condition includes a temperature of about 300° C. to 700° C.

5. The method of claim 1, wherein promotion of growth of crystalline nanowires is implemented from sites intrinsic to the substrate.

6. The method of claim 1, wherein promotion of growth of crystalline nanowires is implemented without extrinsically added growth sites for substantially all of the crystalline nanowires.

7. The method of claim 1, wherein
promoting growth of crystalline nanowires includes promoting the growth from a surface material of the substrate, the surface material being a metal-alloy, using catalysts that are intrinsic to the surface material.

8. The method of claim 7, wherein the metal alloy is stainless steel.

9. The method of claim 7, wherein the step of promoting growth of crystalline nanowires is accomplished without the use of gold catalyst.

10. The method of claim 1, wherein
using a single growth condition to promote the growth of crystalline nanowires includes growing the crystalline nanowires extending from the substrate, and with each nanowire having a crystalline core of between 2 nm and 1000 nm in diameter, the core extending in a longitudinal direction, and the amorphous portion is an amorphous shell of between 10 nm and 5000 nm in diameter and surrounding the crystalline core.

11. The method of claim 10, further comprising:

applying charge potentials to an electrode having the nanowires, the charge potentials being sufficient to capture ions within the amorphous portion; and limiting the charge potentials applied to the electrode to a value that is a function of a charge potential at which crystalline portions of the nanowires undergo amorphization.

12. The method of claim 11, wherein the value is around 150 mV.

13. The method of claim 1, wherein the growth of crystalline nanowires is promoted without the use of gold catalyst.

14. The method of claim 1, wherein the substrate is stainless steel.

15. The method of claim 1, wherein the first material is primarily crystalline silicon.

16. The method of claim 1, wherein promoting growth of the amorphous portion does not include forming the amorphous portion from an oxide or nitride.

17. The method of claim 1, wherein promoting growth of the amorphous portion includes promoting growth until the amorphous portion represents over 9 times of a volume of the crystalline nanowires.

* * * * *